(12) United States Patent
Yu et al.

(10) Patent No.: US 9,082,763 B2
(45) Date of Patent: Jul. 14, 2015

(54) JOINT STRUCTURE FOR SUBSTRATES AND METHODS OF FORMING

(75) Inventors: Chen-Hua Yu, Hsin-Chu (TW);
Da-Yuan Shih, Hsin-Chu (TW);
Chih-Hang Tung, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 196 days.

(21) Appl. No.: 13/421,040

(22) Filed: Mar. 15, 2012

(65) Prior Publication Data
US 2013/0241083 A1 Sep. 19, 2013

(51) Int. Cl.
*H01L 23/00* (2006.01)
*H01L 23/48* (2006.01)
(Continued)

(52) U.S. Cl.
CPC ...... *H01L 23/49811* (2013.01); *H01L 21/4853* (2013.01); *H01L 24/05* (2013.01); *H01L 24/13* (2013.01); *H01L 24/16* (2013.01); *H01L 21/44* (2013.01); *H01L 21/441* (2013.01); *H01L 23/48* (2013.01); *H01L 23/52* (2013.01); *H01L 24/42* (2013.01); *H01L 24/45* (2013.01); *H01L 24/81* (2013.01); *H01L 24/85* (2013.01); *H01L 2224/02166* (2013.01); *H01L 2224/0401* (2013.01); *H01L 2224/04042* (2013.01); *H01L 2224/05124* (2013.01); *H01L 2224/05155* (2013.01); *H01L 2224/05166* (2013.01); *H01L 2224/05171* (2013.01); *H01L 2224/05184* (2013.01); *H01L 2224/05567* (2013.01); *H01L 2224/05572* (2013.01); *H01L 2224/05611* (2013.01); *H01L 2224/05644* (2013.01); *H01L 2224/05647* (2013.01); *H01L 2224/05664* (2013.01); *H01L 2224/1134* (2013.01); *H01L 2224/13005* (2013.01); *H01L 2224/13011* (2013.01); *H01L 2224/13016* (2013.01); *H01L 2224/13027* (2013.01); *H01L 2224/13078* (2013.01); *H01L 2224/13124* (2013.01);
(Continued)

(58) Field of Classification Search
CPC .......... H01L 2225/06527; H01L 2225/06506; H01L 2225/0651; H01L 24/42; H01L 24/85; H01L 24/45; H01L 24/46; H01L 24/48; H01L 24/49; H01L 21/44; H01L 21/441; H01L 21/4853; H01L 21/4825; H01L 21/4885; H01L 21/4889; H01L 2223/6611; H01L 2224/42
See application file for complete search history.

(56) References Cited

U.S. PATENT DOCUMENTS 5,917,707 A * 6/1999 Khandros et al. ............. 361/776
5,952,727 A * 9/1999 Takano et al. ................. 257/784
(Continued)

OTHER PUBLICATIONS

Davis, E.M. et al., "Solid Logic Technology: Versatile, High-Performance Microelectronics," IBM Journal, Apr. 1964, pp. 102-114.
(Continued)

*Primary Examiner* — David Zarneke
(74) *Attorney, Agent, or Firm* — Slater & Matsil, L.L.P.

(57) ABSTRACT

Disclosed embodiments include wire joints and methods of forming wire joints that can enable realization of fine pitch joints and collapse control for various packages. A first embodiment is a structure comprising a first substrate, a second substrate, and a wire joint. The first substrate comprises a first bonding surface, and the second substrate comprises a second bonding surface. The first bonding surface is opposite and faces the second bonding surface. The wire joint is attached to and between the first bonding surface and the second bonding surface.

22 Claims, 9 Drawing Sheets

(51) Int. Cl.
*H01L 23/52* (2006.01)
*H01L 29/40* (2006.01)
*H01L 21/44* (2006.01)
*H01L 21/441* (2006.01)
*H01L 21/48* (2006.01)
*H01L 23/498* (2006.01)

(52) U.S. Cl.
CPC ............ *H01L2224/13139* (2013.01); *H01L 2224/13144* (2013.01); *H01L 2224/13147* (2013.01); *H01L 2224/1411* (2013.01); *H01L 2224/16147* (2013.01); *H01L 2224/16225* (2013.01); *H01L 2224/16227* (2013.01); *H01L 2224/45144* (2013.01); *H01L 2224/48463* (2013.01); *H01L 2224/4911* (2013.01); *H01L 2224/81191* (2013.01); *H01L 2224/81815* (2013.01); *H01L 2224/83411* (2013.01); *H01L 2924/00013* (2013.01); *H01L 2924/00014* (2013.01); *H01L 2924/10253* (2013.01); *H01L 2924/18161* (2013.01)

(56) References Cited

U.S. PATENT DOCUMENTS

| | | | | |
|---|---|---|---|---|
| 5,977,643 | A * | 11/1999 | You et al. | 257/784 |
| 6,023,103 | A * | 2/2000 | Chang et al. | 257/781 |
| 6,107,682 | A * | 8/2000 | Fjelstad | 257/693 |
| 6,268,662 | B1 * | 7/2001 | Test et al. | 257/784 |
| 7,253,514 | B2 * | 8/2007 | Legen et al. | 257/696 |
| 7,494,924 | B2 * | 2/2009 | Shiu et al. | 438/666 |
| 7,572,679 | B2 * | 8/2009 | Gupta et al. | 438/124 |
| 7,683,484 | B2 * | 3/2010 | Yano et al. | 257/737 |
| 2002/0036338 | A1 * | 3/2002 | Matsuo et al. | 257/686 |
| 2002/0036340 | A1 * | 3/2002 | Matsuo et al. | 257/698 |
| 2005/0067689 | A1 * | 3/2005 | Hedler et al. | 257/706 |
| 2005/0133928 | A1 * | 6/2005 | Howard et al. | 257/773 |
| 2012/0061816 | A1 * | 3/2012 | Song et al. | 257/696 |
| 2012/0280386 | A1 * | 11/2012 | Sato et al. | 257/737 |
| 2013/0075916 | A1 * | 3/2013 | Choi | 257/773 |

OTHER PUBLICATIONS

Kawahara, "SuperCSP™, IEEE Transactions on Advanced Packaging," May 2000, pp. 215-219, vol. 23, No. 2.

Reche, J. et al., "Wafer level packaging having bump-on-polymer structure," Micorelectronics Reliability, Pergamon, 2003, pp. 879-894, Elsevier Science Ltd.

Rajoo, R. et al., "Super Stretched Solder Interconnects for Wafer Level Packaging," Electronic Components and Technology Conference, 2006, pp. 1227-1232, IEEE.

Lee, C.-C. et al., "3-D Structure Design and Reliability Analysis of Wafer Level Package With Stress Buffer Mechanism," IEEE Transactions and Components and Packaging Technologies, Mar. 2007, pp. 110-118, vol. 30, No. 1, IEEE.

Chang, S.-M. et al., "A Novel Design Structure for WLCSP With High Reliability, Low Cost, and Ease of Fabrication," IEEE Transactions on Advanced Packaging, Aug. 2007, pp. 377-383, vol. 30, No. 3, IEEE.

* cited by examiner

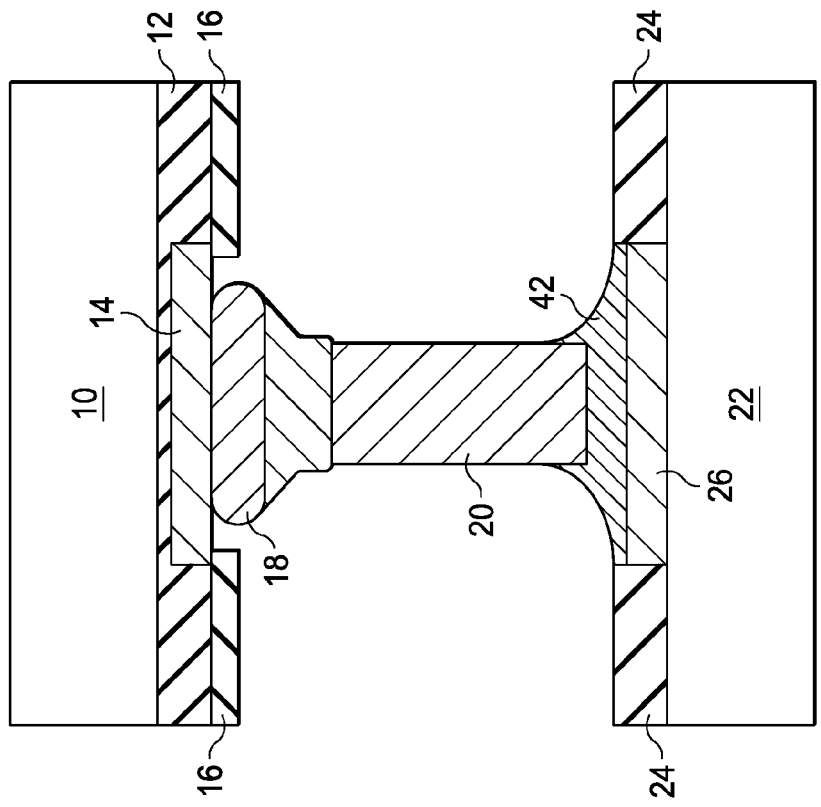
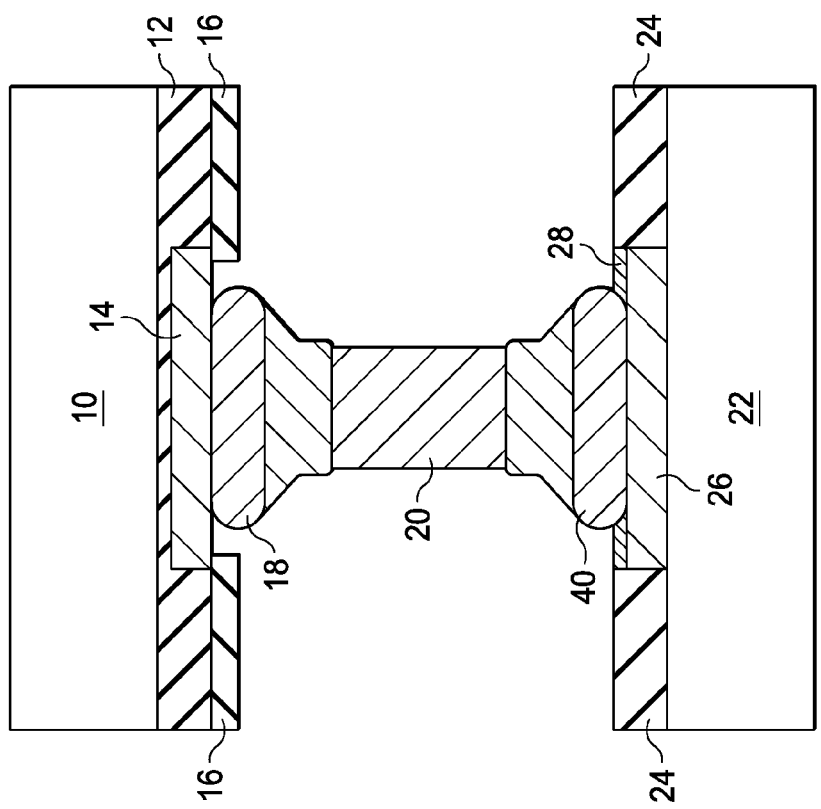
FIG. 5
FIG. 6

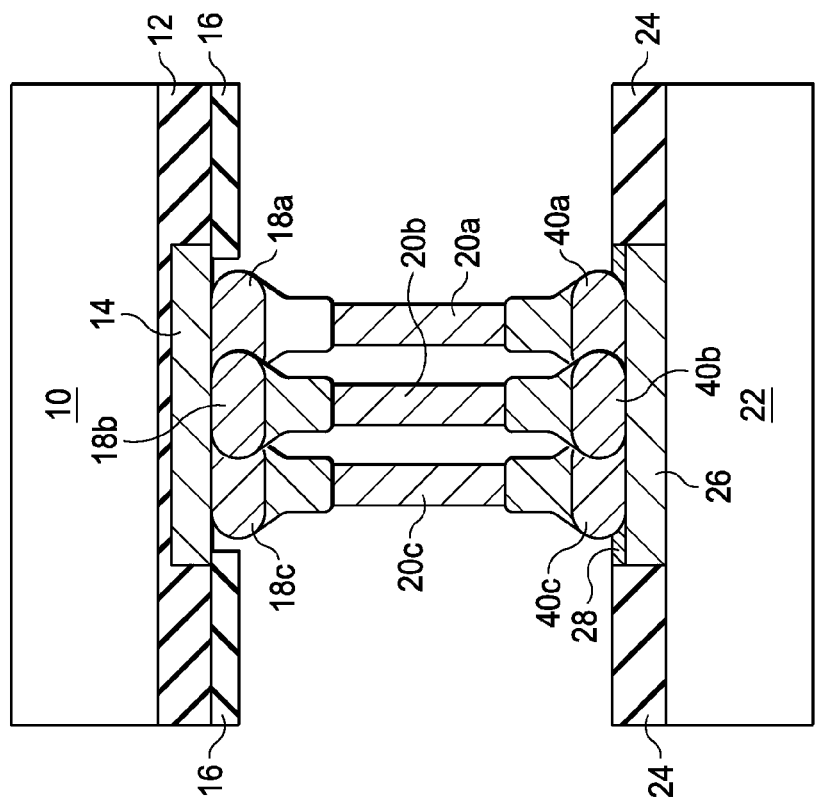
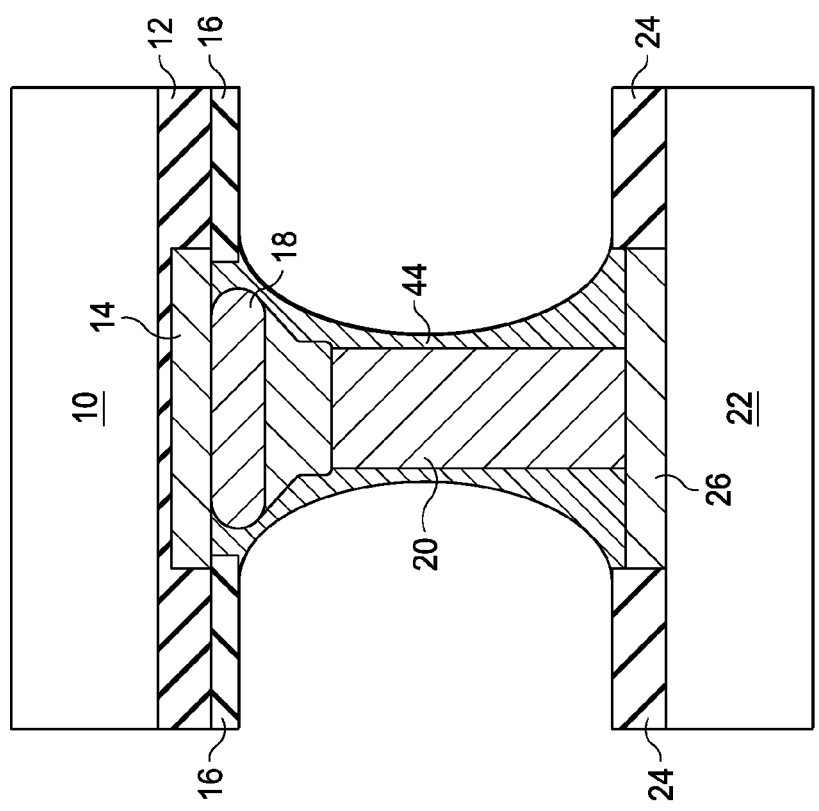
FIG. 8
FIG. 7

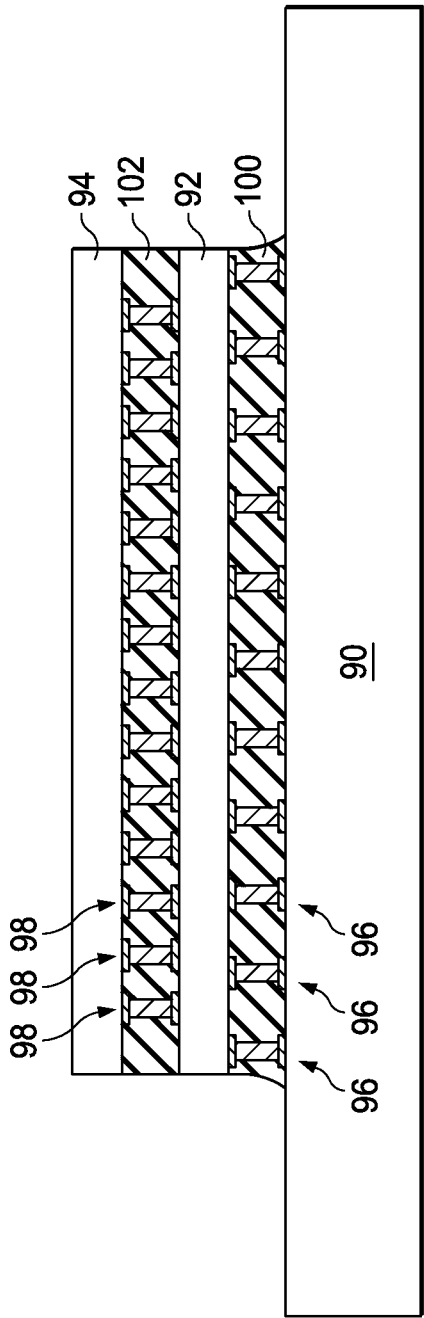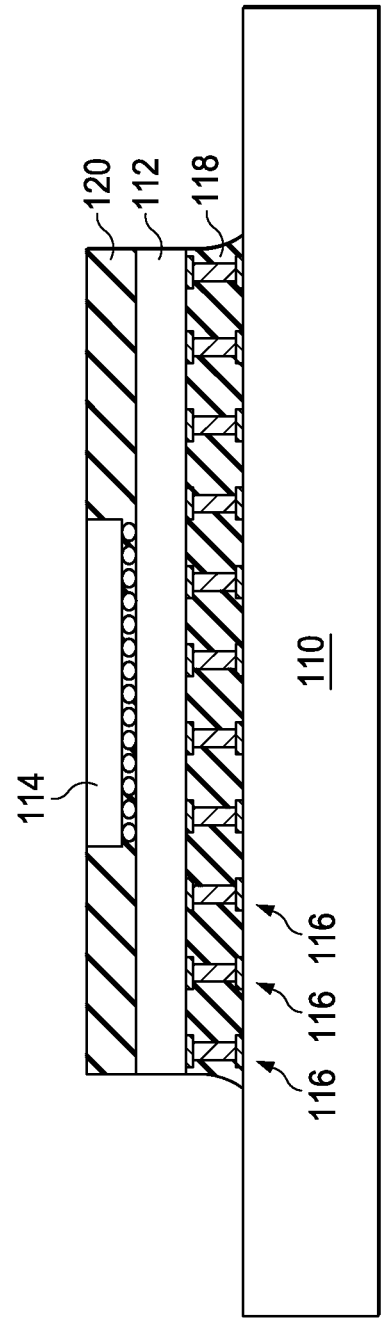

US 9,082,763 B2

JOINT STRUCTURE FOR SUBSTRATES AND METHODS OF FORMING

BACKGROUND

Electronics can be divided into a simple hierarchy consisting of devices such as integrated circuit (IC) chips, packages, printed circuit boards (PCB), and a system. The package is the interface between an electronic device, such as a computer chip, and a PCB. Devices are made from semiconductor materials such as silicon. Integrated circuits are assembled into a package such as a quad flat pack (QFP), pin grid array (PGA), or ball grid array (BGA), using wire bonding (WB), tape automated bonding (TAB), or flip chip (FC) bumping assembly techniques. The packaged device is then attached either directly to a printed wiring board or to another type of substrate, which is defined as the second level of packaging.

Ball grid array (BGA) packaging technology generally is an advanced semiconductor packaging technology, which is characterized in that a semiconductor chip is mounted on a front surface of a substrate, and a plurality of conductive elements such as solder balls are arranged in a matrix array, customarily referred to as ball grid array, on a back surface of the substrate. The ball grid array allows the semiconductor package to be bonded and electrically connected to an external PCB or other electronic devices. The BGA package may be employed in a memory such as Dynamic Random Access Memory and others.

A basic flip-chip (FC) packaging technology comprises an IC, an interconnect system, and a substrate. A function chip is connected to the substrate with a plurality of solder bumps, wherein the solder bumps forming a metallurgical interconnection between the chip and the substrate. The function chip, the solder bump, and the substrate form a flip-chip package. Further, a plurality of balls form a ball grid array (BGA).

Wire bonding can be used to make the electrical connections from chip components such as chip resistors or chip capacitors to substrate. Two function chips are stacked on top of a plurality of substrate layers. The chips are connected to the substrate by a plurality of bonding gold wires. Other form of wires such as aluminum wire can be used, too. The function chips, the gold wire, and the substrate form a wire bonding (WB) package.

Package-on-Package (PoP) is an integrated circuit packaging technique to allow vertically combining, for example, discrete logic and memory ball grid array (BGA) packages. Two or more packages are installed on top of one another, e.g. stacked, with a standard interface to route signals between them. This allows higher density, for example in the mobile telephone/PDA market.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 5 is the wire extension of FIG. 1 bonded to the bond pad of FIG. 3 according to an embodiment;

FIG. 6 is the wire extension of FIG. 1 bonded to the bond pad of FIG. 4 according to an embodiment;

FIG. 7 is the wire extension of FIG. 1 bonded to the bond pad of FIG. 4 using sufficient flux and solder such that reflowed solder extends fully between bonding surfaces of the substrates according to an embodiment;

FIG. 8 is the multiple wire balls with wire extensions of FIG. 2 bonded to the bond pad of FIG. 3 according to an embodiment;

FIG. 16 is a three-dimensional integrated circuit (3DIC) on a PCB, where the structure comprises wire joints, according to an embodiment;

FIG. 17 depicts a two-and-a-half-dimensional integrated circuit (2.5DIC) structure attached to a PCB, where the structure comprises wire joints, according to an embodiment.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to specific contexts, namely a wire joint for a package-on-package structure, a three-dimensional integrated circuit (3DIC) package, a two-and-a-half-dimensional integrated circuit (2.5DIC), or the like. Other embodiments may also be applied, however, to other structures in which electrical connections can be formed between substrates.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be and usually is applicable for many components within a structure.

Figure 1:
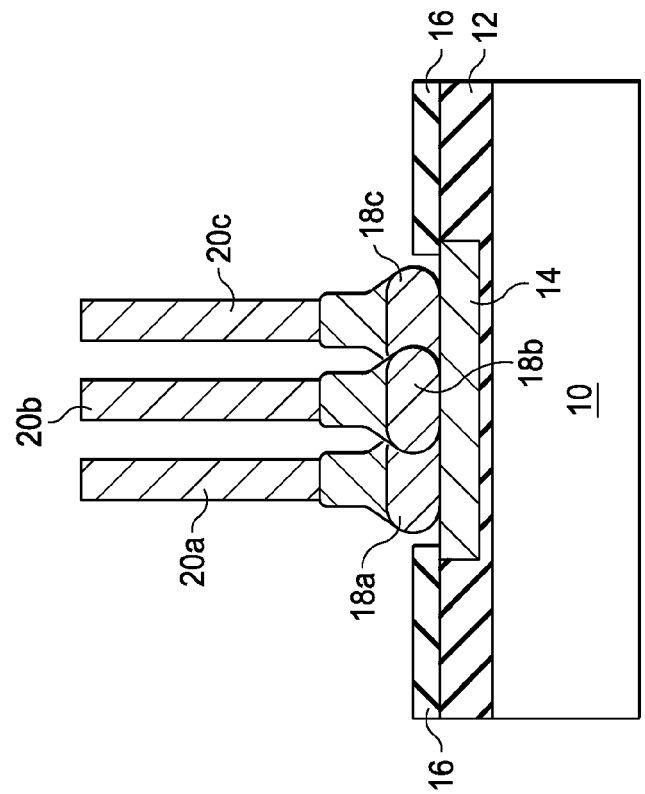
FIG. 1 is a wire ball and wire extension bonded to a bond pad on a first substrate according to an embodiment.

FIG. 1 shows a wire ball 18 bonded to a bond pad 14 on a first substrate 10. A wire extension 20 protrudes a predetermined distance from the wire ball 18. The first substrate 10 can be any substrate, such as an integrated circuit chip, an interposer, an organic substrate, a laminate substrate, a printed circuit board (PCB), or the like. As depicted in FIG. 1, the first substrate 10 includes a dielectric layer 12 in which the bond pad 14 is formed. A passivation layer 16 is over the dielectric layer 12 and has an opening exposing the bond pad 14. The dielectric layer 12 and the passivation layer 16 may each be an acceptable dielectric layer. The bond pad 14 can comprise a conductive material, such as a metal, metal alloy, and/or layers of a metal or metal alloy. Example metals include aluminum, copper, gold, nickel, palladium, titanium, tungsten, chromium, or the like. As a further example, the bond pad 14 can be layered nickel/palladium/gold, layered nickel/gold, layered nickel/palladium, alloyed titanium-tungsten, layered chromium/copper, or the like. It should be noted that the configuration of the first substrate 10, dielectric layer 12, bond pad 14, and passivation layer 16 in FIG. 1 is merely an example, and embodiments contemplate various configurations, such as various number and patterns of metallization and dielectric layers, various numbers of passivation layers, and additional components such as a metallization layer(s) contacting the bond pad 14 and extending over the passivation layer 16.

The wire ball 18 is formed, for example, by melting a tip of a wire to form a sphere at the tip. The sphere is then placed on the bond pad 14, and a mechanical force, heat, and/or ultrasonic energy is applied to bond the sphere to the bond pad 14 and to form the wire ball 18. The wire is then cut and/or broken the predetermined distance from the wire ball 18. The wire can be copper, gold, aluminum, silver, an alloy, the like, or a combination thereof. The wire ball 18 has a diameter D1, for example, between approximately 20 µm and approximately 100 µm. The wire, and hence the wire extension 20, has a diameter D2, for example, between approximately 5 µm and approximately 50 µm. It should be noted that the diameter D1 of the wire ball 18 may depend upon the diameter D2 of the wire, as a person having ordinary skill in the art will readily recognize. The wire ball 18 has a height H1, for example, between approximately 10 µm and approximately 100 µm. The wire extension 20 has a height H2 (such as the predetermined distance), for example, between approximately 10 µm and approximately 200 µm. The heights H1 and H2 can have a combined height, for example, between approximately 20 µm and approximately 300 µm.

Figure 2:
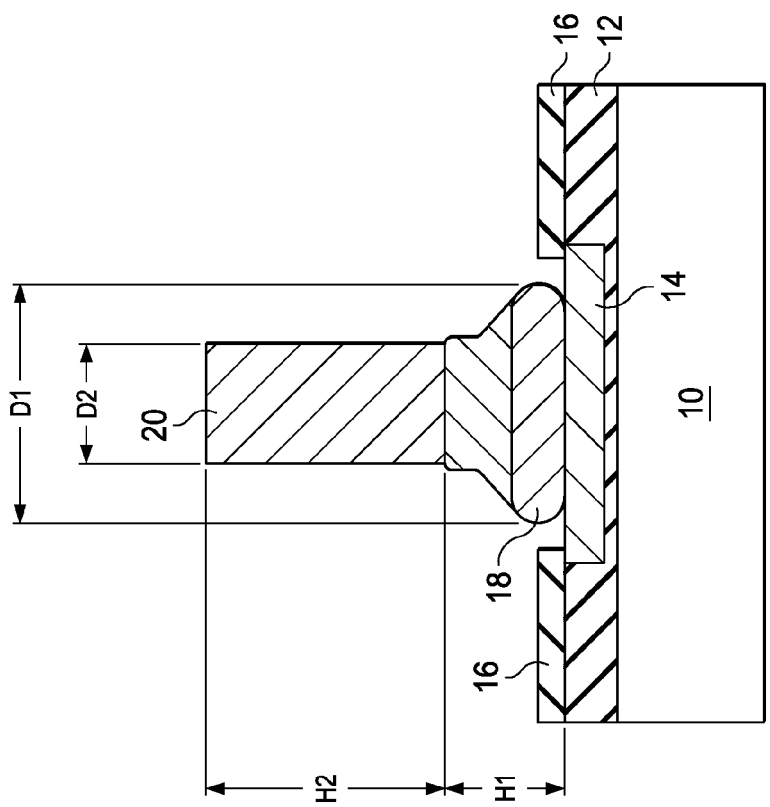
FIG. 2 is multiple wire balls and corresponding wire extensions bonded to a bond pad on a first substrate according to an embodiment.

FIG. 2 shows multiple wire balls 18a, 18b, and 18c bonded to a bond pad 14 on a first substrate 10. Wire extensions 20a, 20b, and 20c protrude a predetermined distance from the respective wire balls 18a, 18b, and 18c. In the embodiment shown in FIG. 2, three wire balls 18a, 18b, and 18c and wire extensions 20a, 20b, and 20c are shown bonded to the bond pad 14, although other embodiments contemplate various numbers of wire balls and wire extensions bonded to a single bond pad. The number of wire balls that can be bonded to a single bond pad generally depends upon the area of the bond pad available for bonding and the diameter of the wire used, as a person having ordinary skill in the art will readily understand. Further, the diameter of the wire used may also affect the predetermined distance that the wires can be cut. For example, larger diameter wires can be cut a larger predetermined distance from a wire ball than finer diameter wires generally can be cut.

Figure 3:
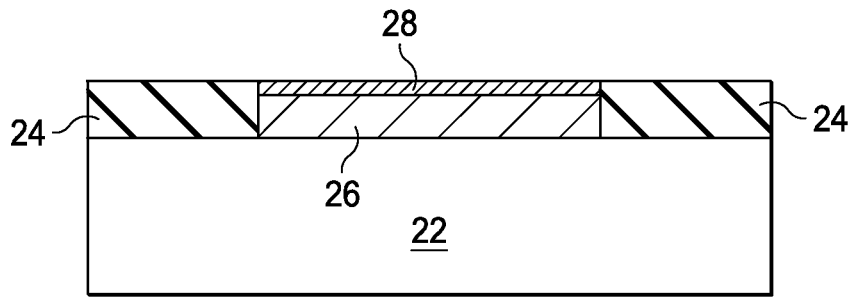
FIG. 3 is a second substrate with a bond pad according to an embodiment.

FIG. 3 illustrates a second substrate 22 with a bond pad 26. The second substrate 22 can be any substrate, such as an integrated circuit substrate, an interposer, an organic substrate, a printed circuit board (PCB), or the like. As depicted in FIG. 3, the second substrate 22 includes a passivation layer 24 over the second substrate 22 on which the bond pad 26 is formed. The passivation layer 24 has an opening exposing the bond pad 26. The passivation layer 24 may be an acceptable dielectric layer. A protection layer 28 is formed over the bond pad 26. The bond pad 26 can comprise a conductive material, such as a metal, metal alloy, and/or layers of a metal or metal alloy. Example metals include aluminum, copper, gold, nickel, palladium, titanium, tungsten, chromium, tantalum nitride, or the like. As a further example, the bond pad 26 can be layered nickel/palladium/gold, layered nickel/gold, layered nickel/palladium, alloyed titanium-tungsten, layered chromium/copper, or the like. The protection layer 28 can be, for example, an organic solderability preservative (OSP) or the like. It should be noted that the configuration of the second substrate 22, passivation layer 24, and bond pad 26 in FIG. 3 is merely an example, and embodiments contemplate various configurations, such as various number and patterns of metallization and dielectric layers, various numbers of passivation layers, and additional components such as a metallization layer(s) contacting the bond pad 26 and extending over the passivation layer 24.

Figure 4:
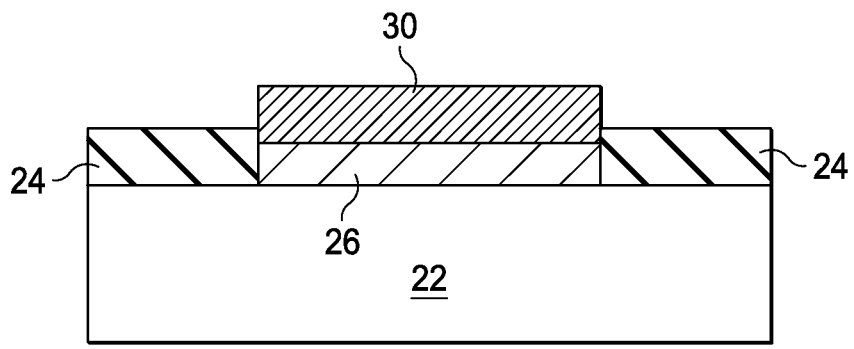
FIG. 4 is a second substrate with a bond pad having solder formed over the bond pad according to an embodiment.

FIG. 4 is a second substrate 22 with a bond pad 26 having solder 30 formed over the bond pad 26. The solder 30 can be an acceptable solder material, such as tin-silver-copper (Sn—Ag—Cu) solder or the like.

FIG. 5 illustrates the wire extension 20 of FIG. 1 bonded to the bond pad 26 of FIG. 3. The wire extension 20 can be bonded to the bond pad 26 by using a low temperature bonding process and/or by applying ultrasonic energy to the wire extension 20 thereby forming a wire ball 40 bonded to the bond pad 26, for example, when a gold wire is used. In this embodiment, the bonding surfaces of the substrates 10 and 22, for example, the bond pad 14 of the first substrate 10 and the bond pad 26 of the second substrate 22, are parallel and oppose each other with the wire balls 18 and 40 and wire extension 20 therebetween.

FIG. 6 illustrates the wire extension 20 of FIG. 1 bonded to the bond pad 26 of FIG. 4. The wire extension 20 can be bonded to the bond pad 26 by reflowing the solder 30 on the bond pad 26 to form a reflowed solder 42 having a meniscus between the wire extension 20 and the bond pad 26 and/or passivation layer 24. In this embodiment, the bonding surfaces of the substrates 10 and 22, for example, the bond pad 14 of the first substrate 10 and the bond pad 26 of the second substrate 22, are parallel and oppose each other with the wire ball 18, wire extension 20, and reflowed solder 42 therebetween. The wire extension 20 may directly contact the bond pad 26 although some reflowed solder 42 is disposed between the wire extension 20 and the bond pad 26 in FIG. 6.

FIG. 7 illustrates the wire extension 20 of FIG. 1 bonded to the bond pad 26 of FIG. 4 using sufficient flux and solder 30 such that reflowed solder 44 extends fully between bonding surfaces of the substrates 10 and 22. The wire extension 20 can be bonded to the bond pad 26 by reflowing the solder 30 on the bond pad 26 to form the reflowed solder 44 having a meniscus between the bond pad 14 (and/or passivation layer 16) and the bond pad 26 (and/or passivation layer 24). In this embodiment, the bonding surfaces of the substrates 10 and 22, for example, the bond pad 14 of the first substrate 10 and the bond pad 26 of the second substrate 22, are parallel and oppose each other with the wire ball 18, wire extension 20, and reflowed solder 44 therebetween. The wire extension 20 may not directly contact the bond pad 26 in embodiments, although in FIG. 7, the wire extension 20 directly contacts the bond pad 26.

Figure 9:
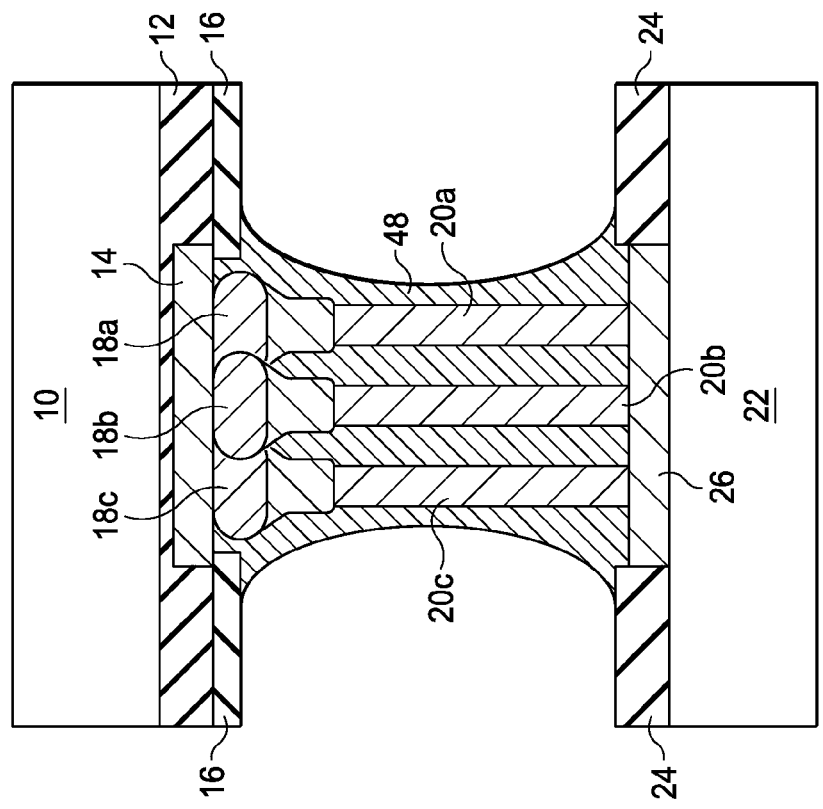
FIG. 9 is the multiple wire balls with wire extensions of FIG. 2 bonded to the bond pad of FIG. 4 according to an embodiment.
Figure 10:
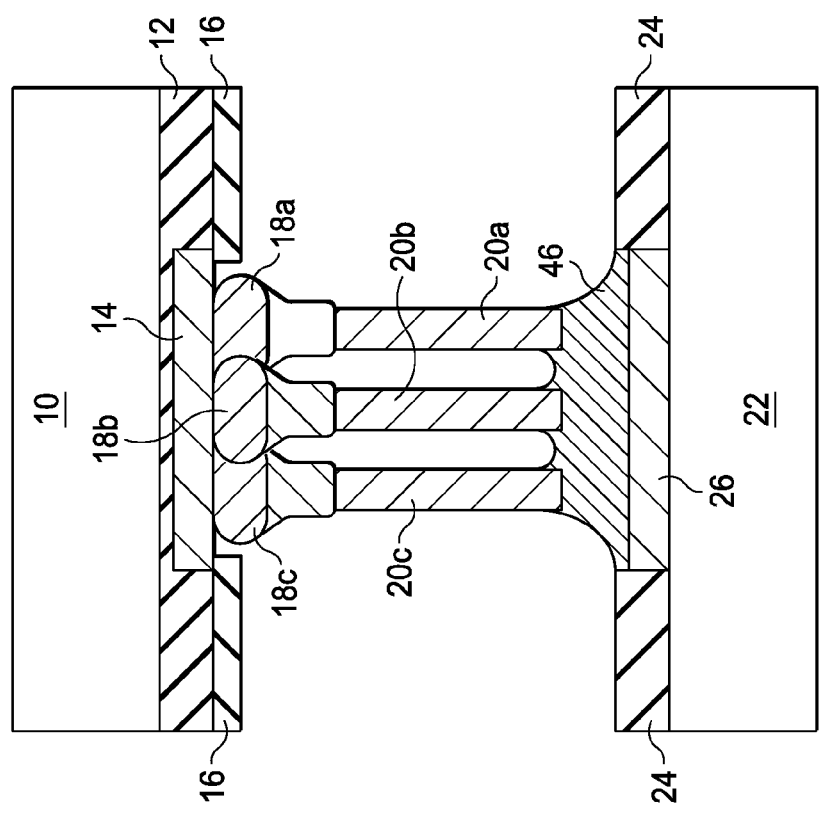
FIG. 10 is the multiple wire balls with wire extensions of FIG. 2 bonded to the bond pad 26 of FIG. 4 using sufficient flux and solder such that reflowed solder extends fully between bonding surfaces of the substrates according to an embodiment.

FIGS. 8 through 10 are similar to the structures depicted in FIGS. 5 through 7, respectively, with the multiple wire balls 18a, 18b, and 18c with wire extensions 20a, 20b, and 20c shown in FIG. 2 being used instead of the wire ball 18 with wire extension 20 in FIG. 1.

FIG. 8 illustrates the multiple wire balls 18a, 18b, and 18c with wire extensions 20a, 20b, and 20c of FIG. 2 bonded to the bond pad 26 of FIG. 3. The wire extensions 20a, 20b, and 20c can be bonded to the bond pad 26 by using a low temperature bonding process and/or by applying ultrasonic energy to the wire extension 20 thereby forming wire balls 40a, 40b, and 40c bonded to the bond pad 26.

FIG. 9 illustrates the multiple wire balls 18a, 18b, and 18c with wire extensions 20a, 20b, and 20c of FIG. 2 bonded to the bond pad 26 of FIG. 4. The wire extension 20 can be bonded to the bond pad 26 by reflowing the solder 30 on the bond pad 26 to form a reflowed solder 46 having a meniscus between the wire extensions 20a, 20b, and 20c and the bond pad 26 (and/or passivation layer 24) and between adjacent wire extensions 20a, 20b, and 20c.

FIG. 10 illustrates the multiple wire balls 18a, 18b, and 18c with wire extensions 20a, 20b, and 20c of FIG. 2 bonded to the bond pad 26 of FIG. 4 using sufficient flux and solder 30 such that reflowed solder 48 extends fully between bonding surfaces of the substrates 10 and 22. The wire extensions 20a, 20b, and 20c can be bonded to the bond pad 26 by reflowing the solder 30 on the bond pad 26 to form the reflowed solder 48 having a meniscus between the bond pad 14 (and/or passivation layer 16) and the bond pad 26 (and/or passivation layer 24) and being in spaces between adjacent wire extensions 20a, 20b, and 20c.

Figure 11:
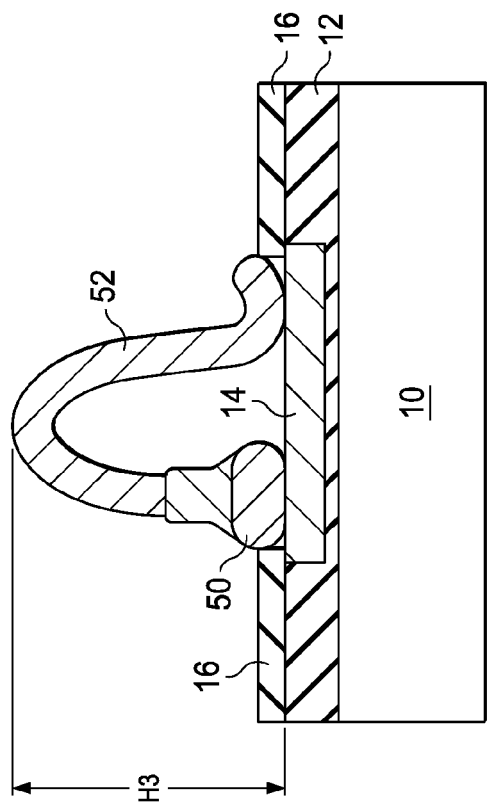
FIG. 11 is a wire ball and bent wire extension bonded to a bond pad on a first substrate according to an embodiment.

FIG. 11 shows a wire ball 50 bonded to a bond pad 14 on a first substrate 10. A wire extension 52 protrudes a predetermined distance from the wire ball 50. The wire ball 50 is formed, for example, by melting a tip of a wire to form a sphere at the tip. The sphere is then placed on the bond pad 14, and a mechanical force, heat, and/or ultrasonic energy is applied to bond the sphere to the bond pad 14 to form the wire ball 50. The wire is then bent to double the wire extension 52 to be bonded back on the bond pad 14 such that the wire has a height H3 at an apex of the bend. The wire is then cut and/or broken near the bond pad 14. The wire can be the same or similar to the wire discussed previously. The wire ball 50 has a diameter, for example, between approximately 10 μm and approximately 100 μm. The wire, and hence the wire extension 52, has a diameter, for example, between approximately 5 μm and approximately 50 μm. The wire ball 50 has a height, for example, between approximately 10 μm and approximately 100 μm. The wire extension 52 has the height H1 (such as the predetermined distance) from the bond pad 14, for example, between approximately 20 μm and approximately 300 μm.

Figure 12:
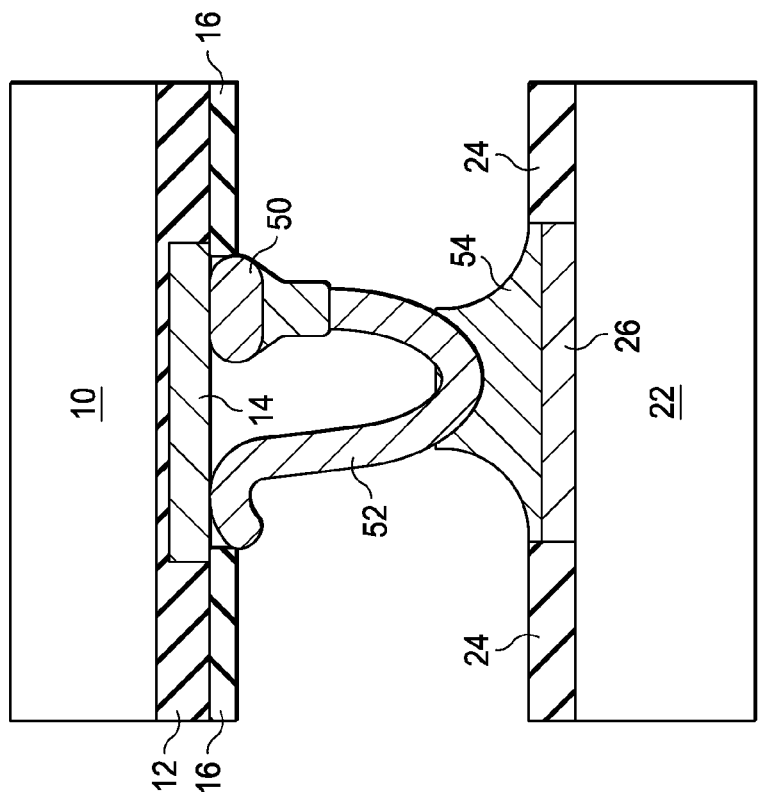
FIG. 12 is the wire extension of FIG. 11 bonded to the bond pad of FIG. 4 according to an embodiment.

FIG. 12 illustrates the wire extension 52 of FIG. 11 bonded to the bond pad 26 of FIG. 4. The wire extension 52 can be bonded to the bond pad 26 by reflowing the solder 30 on the bond pad 26 to form a reflowed solder 54 having a meniscus between the wire extension 52 and the bond pad 26 and/or passivation layer 24. In this embodiment, the bonding surfaces of the substrates 10 and 22, for example, the bond pad 14 of the first substrate 10 and the bond pad 26 of the second substrate 22, are parallel and oppose each other with the wire ball 50, wire extension 52, and reflowed solder 54 therebetween. The wire extension 52 may directly contact the bond pad 26 although some reflowed solder 42 is disposed between the wire extension 52 and the bond pad 26 in FIG. 12.

Figure 13:
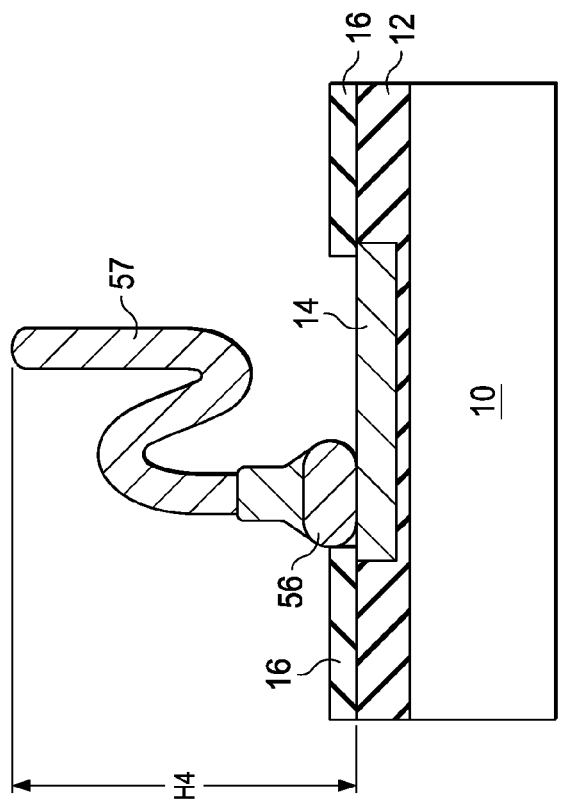
FIG. 13 is a wire ball and bent wire extension with a distal tip on a first substrate according to an embodiment.

FIG. 13 shows a wire ball 56 bonded to a bond pad 14 on a first substrate 10. A wire extension 57 protrudes a predetermined distance from the wire ball 56. The wire ball 56 is formed, for example, by melting a tip of a wire to form a sphere at the tip. The sphere is then placed on the bond pad 14, and a mechanical force, heat, and/or ultrasonic energy is applied to bond the sphere to the bond pad 14 to form the wire ball 56. The wire is then bent to double the wire extension 57 towards the first substrate 10 and then bent back away from the first substrate 10. The wire is then cut and/or broken such that the wire has a height H4 at a tip distal from the first substrate 10. The wire can be the same or similar to the wire discussed previously. The wire ball 56 has a diameter, for example, between approximately 10 μm and approximately 100 μm. The wire, and hence the wire extension 57, has a diameter, for example, between approximately 5 μm and approximately 50 μm. The wire ball 56 has a height, for example, between approximately 10 μm and approximately 100 μm. The wire extension 57 has the height H4 (such as the predetermined distance) from the bond pad 14, for example, between approximately 20 μm and approximately 300 μm.

Figure 14:
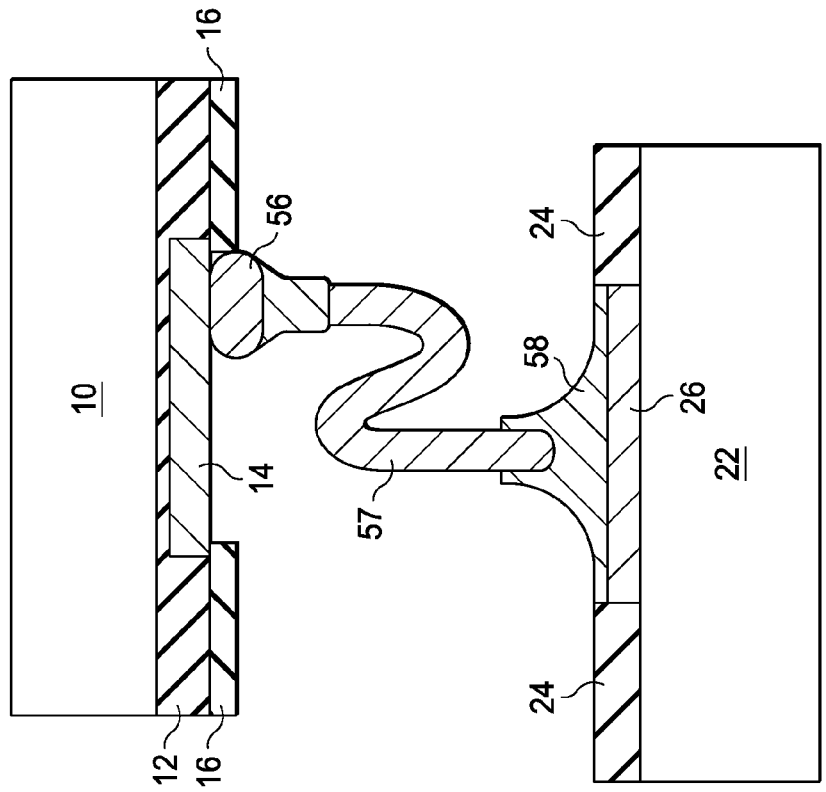
FIG. 14 is the wire extension of FIG. 13 bonded to the bond pad of FIG. 4 according to an embodiment.

FIG. 14 illustrates the distal tip of the wire extension 57 of FIG. 13 bonded to the bond pad 26 of FIG. 4. The wire extension 57 can be bonded to the bond pad 26 by reflowing the solder 30 on the bond pad 26 to form a reflowed solder 58 having a meniscus between the wire extension 57 and the bond pad 26 and/or passivation layer 24. In this embodiment, the bonding surfaces of the substrates 10 and 22, for example, the bond pad 14 of the first substrate 10 and the bond pad 26 of the second substrate 22, are parallel and oppose each other with the wire ball 56, wire extension 57, and reflowed solder 54 therebetween. The wire extension 57 may directly contact the bond pad 26 although some reflowed solder 42 is disposed between the wire extension 57 and the bond pad 26 in FIG. 12.

Embodiments contemplate any practical distance between opposing exterior surfaces of the substrates 10 and 22, such as opposing exterior surfaces of the passivation layers 16 and 24. For example, in some embodiments, the distance between the passivation layers 16 and 24 is between approximately 20 μm and approximately 200 μm, and further, between approximately 100 micrometers and 200 micrometers.

Embodiments may help prevent a substrate from collapsing upon an underlying substrate during a bonding process, such as during a reflow. In a conventional process, only a solder ball is formed bonded between respective pads on opposing substrates. During the reflow step, the solder ball is melted such that it loses rigidity allowing the top substrate to collapse the solder ball due to the weight of the top substrate. The solder ball also could spread beyond the boundary of the bonding pads to maintain its volume when the height decreased due to the collapse. In embodiments, wires, for example, the wire extensions, can maintain a degree of rigidity throughout the bonding process to prevent a top substrate from collapsing on an underlying substrate. For example, if solder is used, during the reflow step, the solder may melt, but the wire may not. Hence, the wire may maintain a rigidity during the reflow to prevent collapsing.

Further, as shown in the above figures, surface tension of solder, if used, can form a meniscus to the wire. This shape can prevent solder from spreading beyond the boundary of the bonding pads during the reflow process. Hence, a distance between adjacent bonding pads on a substrate, such as a pitch, can be reduced. With the formed shapes, there is generally less risk in a short circuit connection between solder that may otherwise occur with conventional solder balls at a similar pitch.

Additionally, embodiments may also be more robust to deflect stress and strain due to a coefficient of thermal (CTE) mismatch of the substrates. The wires, such as the wire extensions, may have a flexibility. When the substrates have a CTE mismatch and are heated, one substrate may expand more than the other, and the wires may be able to bend without breaking. In conventional structures, a solder ball generally is very hard and brittle due to its ball shape such that under similar circumstances, the solder ball may crack or various layers of the substrates may delaminate.

Figure 15:
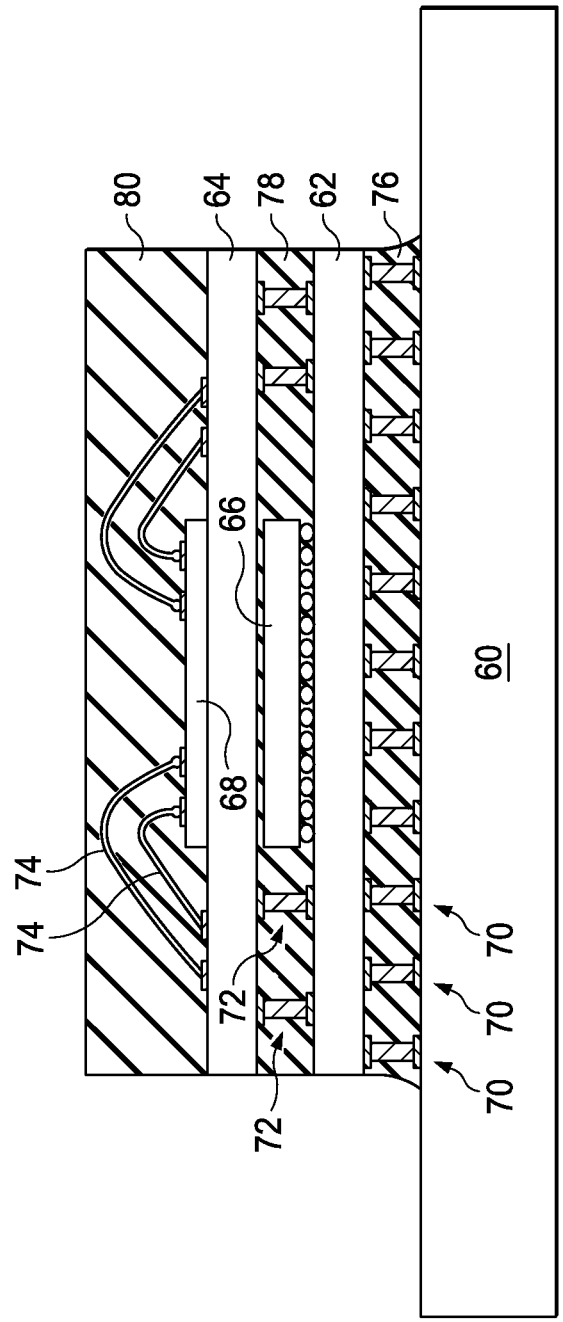
FIG. 15 is a package-on-package (PoP) structure attached to a printed circuit board (PCB), where the structure comprises wire joints, according to an embodiment.

FIGS. 15 through 17 illustrate some applications of embodiments. FIG. 15 depicts a package-on-package (PoP) structure attached to a printed circuit board (PCB) 60. The structure includes the PCB 60, a first substrate 62, and a second substrate 64. Each of the first substrate 62 and the second substrate 64 are, for example, a silicon substrate (such as a silicon chip), a silicon or glass interposer, an organic laminate substrate, or the like. A first chip 66 is attached to a first surface of the first substrate 62 by, for example, controlled collapse chip connection (C4) bumps, microbumps, or the like. A second chip 68 is attached to a first surface of the second substrate 64 using an epoxy and is electrically coupled to the second substrate using wire bonding 74. Wire joint structures 72 electrically and mechanically couple a second surface of the second substrate 64 to the first surface of the first substrate 62. Wire joint structures 70 electrically and mechanically couple a second surface of the first substrate 62 to the PCB 60. The wire joint structures 70 and 72 are, for example, any or a combination of the structures in FIGS. 5 through 10 and 12. An underfill 76 is between the first substrate 62 and the PCB 60 and around the wire joint structures 70, and an underfill 78 is between the second substrate 64 and the first substrate 62 and around the wire joint structures 72. Embodiments contemplate that an underfill, such as underfill 76 and/or 78, is not used. A molding compound 80 encapsulates the second chip 68 and the wire bonding 74 on the first surface of the second substrate 64. As an example, the pitch between adjacent wire joint structures 70 is between approximately 100 µm and approximately 1 mm, and a minimum pitch between adjacent wire joint structures 72 is between approximately 5 µm and approximately 40 µm.

FIG. 16 illustrates a 3DIC on a PCB 90. The structure includes the PCB 90, a first chip 92, and a second chip 94. A first surface of the first chip 92 is attached to a surface of the second chip 94 by wire joint structures 98. A second surface of the first chip 92 is attached to the PCB 90 by wire joint structures 96. The wire joint structures 96 and 98 are, for example, any or a combination of the structures in FIGS. 5 through 10 and 12. An underfill 100 is between the first chip 92 and the PCB 60 and around the wire joint structures 96, and an underfill 102 is between the second chip 94 and the first chip 92 and around the wire joint structures 98. Embodiments contemplate that an underfill is not used. As an example, the pitch between adjacent wire joint structures 96 is between approximately 100 µm and approximately 1 mm, and a minimum pitch between adjacent wire joint structures 98 is between approximately 5 µm and approximately 40 µm.

FIG. 17 depicts a 2.5DIC structure attached to a PCB 110. The structure includes the PCB 110, an interposer 112, and chip 114. The interposer 112 is, for example, a silicon-based interposer. The chip 114 is attached to a first surface of the interposer 112 by, for example, C4 bumps, microbumps, or the like. Wire joint structures 116 electrically and mechanically couple a second surface of the interposer 112 to the PCB 110. The wire joint structures 116 are, for example, any or a combination of the structures in FIGS. 5 through 10 and 12. An underfill 118 is between the interposer 112 and the PCB 110 and around the wire joint structures 116. Embodiments contemplate that an underfill is not used. A molding compound 120 encapsulates the chip 114 on the first surface of the interposer 112. As an example, the pitch between adjacent wire joint structures 116 is between approximately 100 µm and approximately 1 mm.

Figure 18:
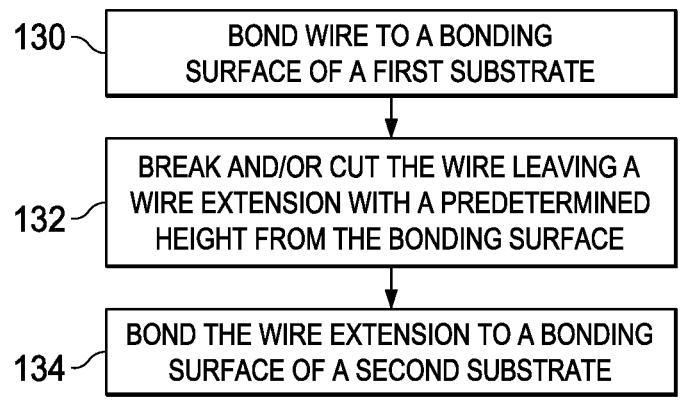
FIG. 18 is a method for forming a wire joint structure according to an embodiment.

FIG. 18 is a method for forming a wire joint structure according to an embodiment. Although described in a particular order, steps of the method can be performed in any logical order. In step 130, a wire is bonded to a bonding surface of a first substrate. The first substrate can be any substrate, such as an integrated circuit substrate, an interposer, an organic substrate, a printed circuit board (PCB), or the like. The bonding surface can be, for example, a bonding pad that comprises a conductive material. A wire tip can be melted to form a sphere at the tip of the wire. The sphere can then be placed on the bonding surface, and a mechanical force, heat, and/or ultrasonic energy can be applied to bond the sphere to the bonding surface, thereby bonding the wire to the bonding surface.

In step 132, the wire is broken and/or cut to leave a wire extension with a predetermined height from the bonding surface. In an embodiment, this may result in the structure in FIG. 1. In another embodiment, steps 130 and 132 can be repeated multiple times for a given bonding surface to result in a structure similar to FIG. 2. In a yet further embodiment, the wire can be bent back and bonded to the bonding surface before being broken and/or cut resulting in an apex of the bend being at the predetermined height from the bonding surface, like the structure in FIG. 11. Steps 130 and 132 may be performed before or after the first substrate is singulated from other substrates. For example, if the first substrate is an interposer, multiple interposers may be processed on a single wafer, and each interposer may be subsequently singulated for packaging.

In step 134, the wire extension is bonded to a bonding surface of a second substrate. The second substrate can be any substrate, such as an integrated circuit substrate, an interposer, an organic substrate, a printed circuit board (PCB), or the like. The bonding surface can be, for example, a bonding pad that comprises a conductive material. Step 134 can use a pick-and-place tool for the bonding. The bonding surfaces of the first substrate and the second substrate are brought to face each other in an opposing manner, and the wire extension is then bonded to the bonding surface of the second substrate. In an embodiment, the bonding surface of the second substrate has a pre-formed solder. The solder is reflowed to bond to the wire extension bonded to the first substrate. This can result in any of the structures depicted in FIGS. 6, 7, 9, 10, and/or 12. In another embodiment, the wire extension is made to contact the bonding surface of the second substrate, and a low temperature bonding process and/or ultrasonic energy is used to bond the wire extension to the bonding surface, such as resulting in the structures of FIGS. 5 and/or 8.

A first embodiment is a structure comprising a first substrate, a second substrate, and a wire joint. The first substrate comprises a first bonding surface, and the second substrate comprises a second bonding surface. The first bonding surface is opposite and faces the second bonding surface. The wire joint is attached to and between the first bonding surface and the second bonding surface.

Another embodiment is a structure comprising a first bond pad, a second bond pad, and a wire joint attached to the first bond pad and the second bond pad. The first bond pad and the second bond pad are electrically conductive. The first bond pad is on a first surface of a first substrate, and the second bond pad is on a second surface of a second substrate. The second surface intersects an axis normal to the first surface.

The wire joint comprises a first wire ball and a wire extension extending from the first wire ball. The first wire ball is attached to the first bond pad.

A further embodiment is a method comprising attaching a wire to a first bonding surface of a first substrate; breaking and/or cutting the wire, a wire extension remaining attached to the first bonding surface; and after breaking and/or cutting the wire, attaching the wire extension to a second bonding surface of a second substrate.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
   a first substrate comprising a first side and a second side, the first side being opposite the second side, the second side comprising a first bonding surface;
   an integrated circuit chip attached to the first side of the first substrate by bumps;
   a second substrate comprising a second bonding surface, the first bonding surface being opposite and facing the second bonding surface; and
   a wire joint attached to and between the first bonding surface and the second bonding surface.

2. The structure of claim 1, wherein the wire joint comprises:
   a first wire ball attached to the first bonding surface;
   a second wire ball attached to the second bonding surface; and
   a wire extension between the first wire ball and the second wire ball.

3. The structure of claim 1, wherein the wire joint comprises
   a wire ball attached to the first bonding surface;
   a wire extension extending from the wire ball; and
   solder attached to the wire extension and the second bonding surface.

4. The structure of claim 3, wherein the wire extension further directly contacts the second bonding surface.

5. The structure of claim 3, wherein the wire extension does not directly contact the second bonding surface.

6. The structure of claim 3, wherein the solder extends from the second bonding surface to the first bonding surface.

7. The structure of claim 1, wherein the wire joint comprises a plurality of wire balls and a plurality of wire extensions, each wire extension extending from a respective wire ball.

8. The structure of claim 1, wherein the wire joint comprises:
   a wire ball attached to the first bonding surface;
   a wire extension extending from the wire ball, the wire extension having a curved portion and a distal portion, the curved portion being between the wire ball and the distal portion along the wire extension, the distal portion being attached to the first bonding surface; and
   solder attached to the curved portion of the wire extension and the second bonding surface.

9. The structure of claim 1, wherein the wire joint comprises:
   a wire ball attached to the first bonding surface;
   a wire extension extending from the wire ball, the wire extension having a first curved portion, a second curved portion, and a distal tip, the first curved portion and the second curved portion being disposed between the wire ball and the distal tip along the wire extension; and
   solder attached to the distal tip of the wire extension and the second bonding surface.

10. The structure of claim 1, wherein each of the first bonding surface and the second bonding surface comprises an electrically conductive bond pad.

11. A structure comprising:
    a first bond pad on a first side of a first substrate, the first bond pad being electrically conductive;
    an integrated circuit chip on a second side of the first substrate, the second side of the first substrate being opposite the first side of the first substrate, the integrated circuit chip being attached to the second side of the first substrate by bumps;
    a second bond pad on a side of a second substrate, the second bond pad being electrically conductive, the side of the second substrate intersecting an axis normal to the first side of the first substrate; and
    a wire joint attached to the first bond pad and the second bond pad, the wire joint comprising a first wire ball and a wire extension extending from the first wire ball, the first wire ball being attached to the first bond pad.

12. The structure of claim 11, wherein the wire joint further comprises a second wire ball attached to the second bond pad.

13. The structure of claim 11, wherein the wire joint further comprises solder attached to the wire extension and the second bond pad.

14. The structure of claim 11, wherein the wire extension comprises a bent portion and a distal portion, the bent portion being between the distal portion and the first wire ball along the wire extension, the distal portion being attached to the first bond pad, and the wire joint further comprises solder attached to the bent portion of the wire extension and the second bond pad.

15. The structure of claim 11, wherein the wire joint comprises a plurality of wire balls and a plurality of wire extensions, each wire extension extending from a respective wire ball.

16. A method comprising:
    attaching a wire to a first bonding surface on a first side of a first substrate;
    breaking and/or cutting the wire, a wire extension remaining attached to the first bonding surface;
    after breaking and/or cutting the wire, attaching the wire extension to a second bonding surface of a second substrate; and
    attaching an integrated circuit chip on a second side of the first substrate using bumps, the second side of the first substrate being opposite the first side of the first substrate.

17. The method of claim 16, wherein the second bonding surface is opposite and facing the first bonding surface during the attaching the wire extension.

18. The method of claim 16, wherein the attaching the wire extension comprises reflowing solder to attach the solder to the wire extension and to the second bonding surface.

19. The method of claim 16 further comprising bending the wire extension and attaching a distal portion of the wire extension to the first bonding surface, a bent portion of the wire extension being attached to the second bonding surface.

20. The method of claim 16, wherein the wire extension is directly attached to the second bonding surface.

21. A The structure comprising:
- a first interposer comprising a first side and a second side, the first side of the first interposer being opposite from the second side of the first interposer, the first side of the first interposer comprising first interposer bonding pads, the second side of the first interposer comprising second interposer bonding pads;
- a first integrated circuit chip on the second side of the interposer and attached by bumps;
- a substrate comprising substrate bonding pads, first wire joints being attached between the first interposer bonding pads and the substrate bonding pads, a first pitch between adjacent ones of the first wire joints being between 100 µm and 1 mm, each of the first wire joints comprising:
  - a wire ball attached to a respective one of the first interposer bonding pads or the substrate bonding pads;
  - a wire extension extending from the wire ball, the wire extension having a curved portion and a distal portion, the curved portion being between the wire ball and the distal portion along the wire extension, the distal portion being attached to the respective one of the interposer bonding pads or the substrate bonding pads; and
  - solder attached to the curved portion of the wire extension and a respective one of the substrate bonding pads or the interposer bonding pads;
- a second interposer comprising a first side and a second side, the first side of the second interposer being opposite from the second side of the second interposer, the first side of the second interposer comprising third interposer bonding pads, second wire joints being attached between the second interposer bonding pads and the third interposer bonding pads, a second pitch being between adjacent ones of the second wire joints, the second pitch being less than the first pitch; and
- a second integrated circuit chip on the second side of the second interposer.

22. The structure of claim 1 further comprising an underfill between the first substrate and the second substrate, the underfill surrounding the wire joint.

* * * * *

UNITED STATES PATENT AND TRADEMARK OFFICE
CERTIFICATE OF CORRECTION

PATENT NO. : 9,082,763 B2  Page 1 of 1
APPLICATION NO. : 13/421040
DATED : July 14, 2015
INVENTOR(S) : Chen-Hua Yu et al.

It is certified that error appears in the above-identified patent and that said Letters Patent is hereby corrected as shown below:

In the claims,

In Col. 11, line 10, claim 21, delete "A The" and insert --A--.

Signed and Sealed this
Seventeenth Day of May, 2016

Michelle K. Lee
*Director of the United States Patent and Trademark Office*